US009605837B2

(12) United States Patent
Hino

(10) Patent No.: US 9,605,837 B2
(45) Date of Patent: Mar. 28, 2017

(54) LIGHTING DEVICE

(71) Applicant: Toshiba Lighting & Technology Corporation, Yokosuka-shi, Kanagawa-ken (JP)

(72) Inventor: Kiyokazu Hino, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/781,616

(22) PCT Filed: Dec. 26, 2013

(86) PCT No.: PCT/JP2013/084910
§ 371 (c)(1),
(2) Date: Oct. 1, 2015

(87) PCT Pub. No.: WO2014/162642
PCT Pub. Date: Oct. 9, 2014

(65) Prior Publication Data
US 2016/0053974 A1 Feb. 25, 2016

(30) Foreign Application Priority Data

Apr. 4, 2013  (JP) ................. 2013-078922
Apr. 22, 2013 (JP) ................. 2013-089680
May 9, 2013   (JP) ................. 2013-099515

(51) Int. Cl.
F21V 19/00 (2006.01)
H01L 33/48 (2010.01)
(Continued)

(52) U.S. Cl.
CPC .......... F21V 19/005 (2013.01); H01L 33/486 (2013.01); F21V 29/763 (2015.01);
(Continued)

(58) Field of Classification Search
CPC ........................ F21V 19/005; F21Y 2101/02
See application file for complete search history.

(56) References Cited

U.S. PATENT DOCUMENTS

2012/0057099 A1   3/2012  Tanuma et al.
2013/0163261 A1   6/2013  Shimoji et al.
2014/0145405 A1   5/2014  Suzuki

FOREIGN PATENT DOCUMENTS

DE    102008016534 A1   10/2009
JP    2004-356344 A     12/2004
(Continued)

OTHER PUBLICATIONS

Feb. 4, 2014—International Search Report—Intl App PCT/JP2013/084910.
(Continued)

Primary Examiner — Elmito Breval
(74) Attorney, Agent, or Firm — Banner & Witcoff, Ltd.

(57) ABSTRACT

A lighting device according to an embodiment includes a board that contains ceramics on at least a surface thereof, a light emitting element that is provided on the surface of the board, a wiring pattern that is provided on the surface of the board and is electrically connected to the light emitting element, a surrounding wall member that is provided to surround the light emitting element, a joining portion that is provided between the board and the surrounding wall member, and a coating portion that is provided between the board and the joining portion and contains a glass material.

19 Claims, 10 Drawing Sheets

(51) Int. Cl.
  *H01L 33/60*   (2010.01)
  *F21V 29/76*   (2015.01)
  *F21Y 101/00*  (2016.01)
  *F21Y 105/00*  (2016.01)
(52) U.S. Cl.
  CPC ....... *F21Y 2101/00* (2013.01); *F21Y 2105/00* (2013.01); *F21Y 2115/15* (2016.08); *F21Y 2115/30* (2016.08); *H01L 33/60* (2013.01)

(56) References Cited

FOREIGN PATENT DOCUMENTS

| | | | |
|---|---|---|---|
| JP | 2006-147985 A | | 6/2006 |
| JP | 2012-049378 A | | 3/2012 |
| JP | 2012-094449 A | | 5/2012 |
| JP | 2012-209512 A | | 10/2012 |
| JP | 2012209512 A | * | 10/2012 |
| JP | 2013-025935 A | | 2/2013 |
| JP | 2013-033777 A | | 2/2013 |
| JP | 2013-038373 A | | 2/2013 |
| JP | 2013025935 A | * | 2/2013 |

OTHER PUBLICATIONS

Feb. 4, 2014—(WO) Written Opinion—App PCT/JP2013/084910.
Oct. 7, 2016—(EP) Extended Search Report—App 13881009.8.
Jan. 30, 2017—(JP) Notice of Reasons for Refusal—App 2013-089680.

* cited by examiner

LIGHTING DEVICE

TECHNICAL FIELD

Embodiments described herein relate generally to a lighting device.

BACKGROUND ART

There is a lighting device which includes a board, a plurality of light emitting diodes (LEDs) mounted on the board; a surrounding wall member which is adhered onto the board so as to surround the plurality of light emitting diodes, and a sealing portion which fills the inside of the surrounding wall member.

In such a lighting device, if a board made of ceramics is used, there is a problem in that fixation strength (adhesion strength) between the surrounding wall member and the board is reduced.

If the fixation strength between the surrounding wall member and the board is reduced, a portion which is partially susceptible to external stress or thermal impact is formed. For this reason, there is a concern that airtightness between the surrounding wall member and the board may decrease, and thus performance may deteriorate due to permeation of moisture or gas, or poor conduction caused by separation of the sealing portion may occur.

Therefore, development of a lighting device capable of improving the fixation strength between the surrounding wall member and the board is desirable even if the board made of ceramics is used.

CITATION LIST

Patent Literature

[PTL 1] JP-A-2013-25935

SUMMARY OF INVENTION

Technical Problem

An object of the present invention is to provide a lighting device capable of improving fixation strength between a surrounding wall member and a board.

Solution to Problem

A lighting device according to an embodiment includes: a board that contains ceramics on at least a surface thereof; a light emitting element that is provided on the surface of the board; a wiring pattern that is provided on the surface of the board and is electrically connected to the light emitting element; a surrounding wall member that is provided to surround the light emitting element; a joining portion that is provided between the board and the surrounding wall member; and a coating portion that is provided between the board and the joining portion and contains a glass material.

Advantageous Effects of Invention

According to the embodiment of the present invention, a lighting device capable of improving fixation strength between a surrounding wall member and a board can be provided.

DESCRIPTION OF EMBODIMENTS

Figure 1:
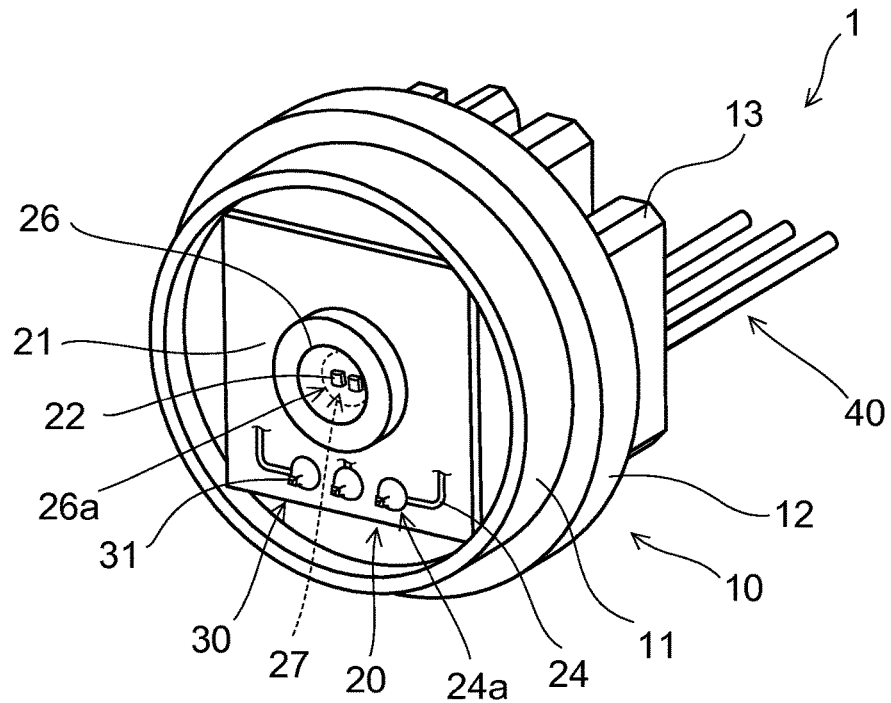
FIG. 1 is a schematic perspective view for exemplifying a lighting device 1 according to the present embodiment.

A first invention relates to a lighting device including a board that contains ceramics on at least a surface thereof; a light emitting element that is provided on the surface of the board; a wiring pattern that is provided on the surface of the board and is electrically connected to the light emitting element; a surrounding wall member that is provided to surround the light emitting element; a joining portion that is provided between the board and the surrounding wall member; and a coating portion that is provided between the board and the joining portion and contains a glass material.

According to the lighting device, the fixation strength between the surrounding wall member and the board can be improved.

A second invention relates to the lighting device according to the first invention, in which a center line mean roughness of a surface of the coating portion exceeds 0.3 µm.

According to the lighting device, the fixation strength between the surrounding wall member and the board can be further improved.

A third invention relates to the lighting device according to the first invention, in which the joining portion contains a silicone resin.

According to the lighting device, the fixation strength between the surrounding wall member and the board can be further improved.

A fourth invention relates to the lighting device according to the first invention, in which a linear expansion coefficient of the joining portion is greater than a linear expansion coefficient of the board and is smaller than a linear expansion coefficient of the surrounding wall member.

According to the lighting device, the fixation strength between the surrounding wall member and the board can be further improved.

A fifth invention relates to the lighting device according to the first invention, further including a coating portion that is provided between the board and the joining portion and at least around the wiring pattern provided in a region where the surrounding wall member is provided.

According to the lighting device, the surrounding wall member can be prevented from being provided in a tilted manner.

A sixth invention relates to the lighting device according to the fifth invention, in which the coating portion includes a first part that is provided to cover the region where the surrounding wall member is provided; and a second part that is provided on the first part and around the first part provided on the wiring pattern.

According to the lighting device, the surrounding wall member can be prevented from being provided in a tilted manner. In addition, malfunction caused by pinholes of the coating portion can be minimized, and thus reliability of the lighting device can be further improved.

A seventh invention relates to the lighting device according to the fifth invention, in which the coating portion includes a third part that is provided around the wiring pattern in the region where the surrounding wall member is provided; and a fourth part that is provided on the wiring pattern and the third part.

According to the lighting device, the surrounding wall member can be prevented from being provided in a tilted manner. In addition, malfunction caused by pinholes of the coating portion can be minimized, and thus reliability of the lighting device can be further improved.

An eighth invention relates to the lighting device according to the fifth invention, further including a support portion that is provided in the region where the surrounding wall member is provided, in which the coating portion is provided at least around the wiring pattern provided in the region where the surrounding wall member is provided and around the support portion.

According to the lighting device, the surrounding wall member can be further prevented from being provided in a tilted manner.

A ninth invention relates to the lighting device according to the eighth invention, in which the support portion is connected to the wiring pattern.

According to the lighting device, the surrounding wall member can be further prevented from being provided in a tilted manner.

A tenth invention relates to the lighting device according to the eighth invention, in which the coating portion includes a first part that is provided to cover the region where the surrounding wall member is provided; and a second part that is provided on the first part, around the first part provided on the wiring pattern, and around the first part provided on the support portion.

According to the lighting device, the surrounding wall member can be further prevented from being provided in a tilted manner. In addition, malfunction caused by pinholes of the coating portion can be minimized, and thus reliability of the lighting device can be further improved.

An eleventh invention relates to the lighting device according to the eighth invention, in which the coating portion includes a third part that is provided around the wiring pattern and the support portion in the region where the surrounding wall member is provided; and a fourth part that is provided on the wiring pattern, the support portion, and the third part.

According to the lighting device, the surrounding wall member can be prevented from being provided in a tilted manner. In addition, malfunction caused by pinholes of the coating portion can be minimized, and thus reliability of the lighting device can be further improved.

A twelfth invention relates to the lighting device according to the first invention, further including a power supply terminal that is electrically connected to the wiring pattern; and a socket that is fitted to the power supply terminal.

First Embodiment

Hereinafter, with reference to the drawings, embodiments will be described. In addition, identical constituent elements are given the same reference numerals throughout the drawings, and detailed description thereof will be omitted as appropriate.

Figure 2:
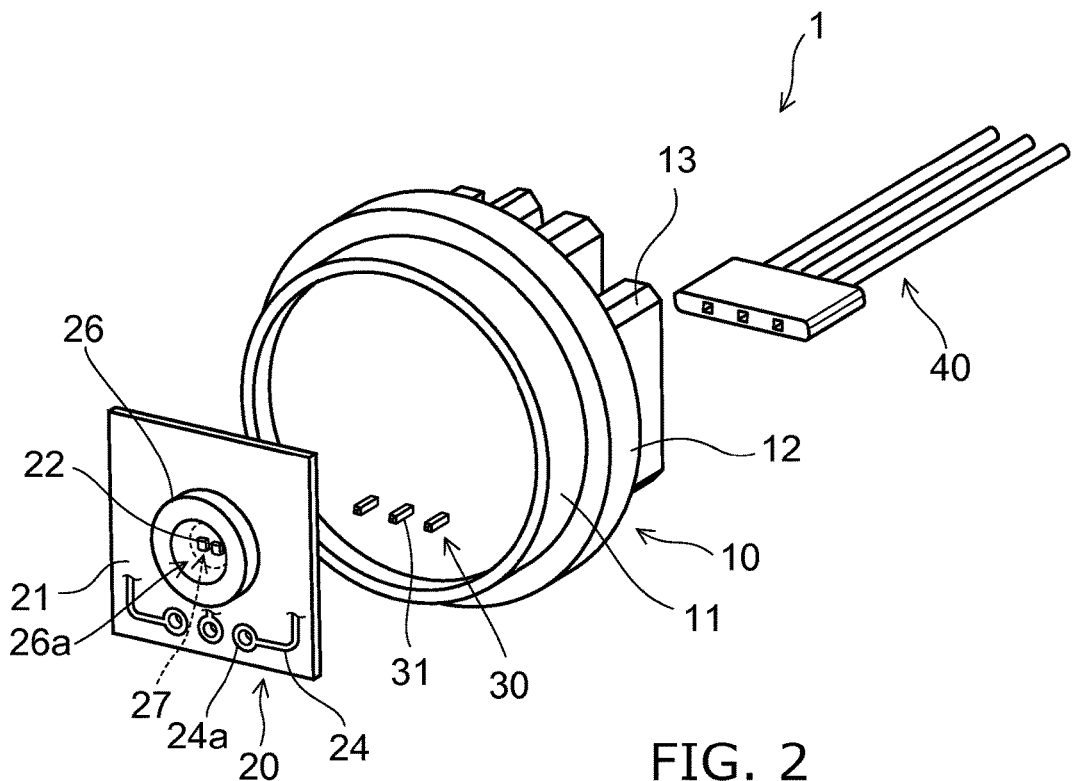
FIG. 2 is a schematic perspective view for exemplifying the lighting device 1 according to the present embodiment.

FIGS. 1 and 2 are schematic perspective views for exemplifying a lighting device 1 according to the present embodiment.

In addition, FIG. 1 is a schematic perspective view of the lighting device 1, and FIG. 2 is a schematic exploded view of the lighting device 1.

Figure 3:
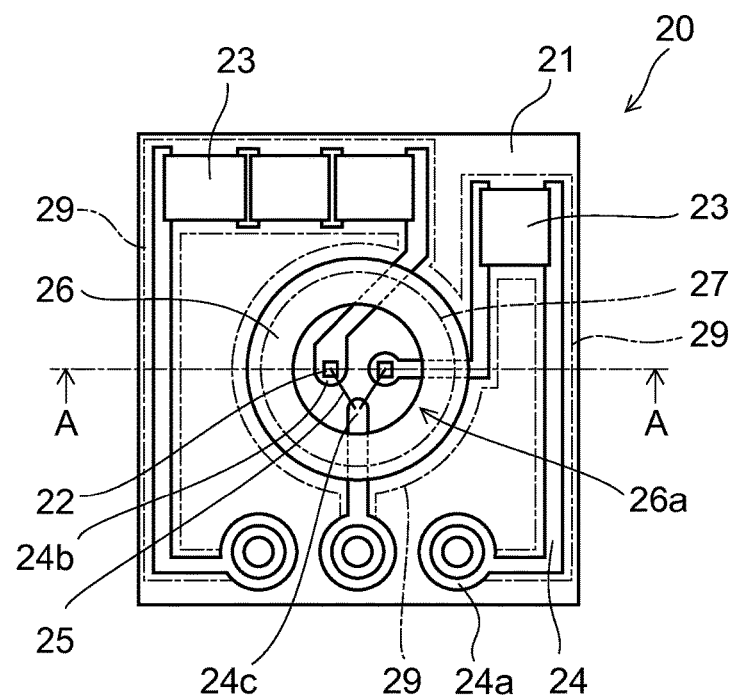
FIG. 3 is a schematic plan view of a light emitting section 20.

FIG. 3 is a schematic plan view of a light emitting section 20.

Figure 4:
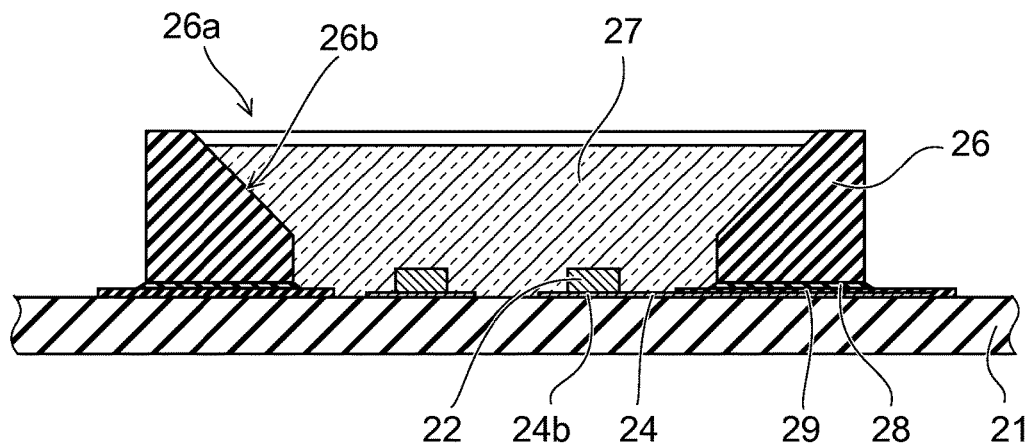
FIG. 4 is a sectional view taken along line A-A in FIG. 3.

FIG. 4 is a cross-sectional view taken along line A-A in FIG. 3.

As illustrated in FIGS. 1 and 2, the lighting device 1 is provided with a main body section 10, a light emitting section 20, a power supply section 30, and a socket 40.

The main body section 10 is provided with a storage portion 11, a flange portion 12, and fins 13.

The storage portion 11 is formed in a circular shape, and protrudes from one surface of the flange portion 12. The light emitting section 20 is stored in the storage portion 11. In addition, power supply terminals 31 of the power supply section 30 protrude inside the storage portion 11.

The flange portion 12 is formed in a disc shape, and has one surface provided with the storage portion 11 and the other surface provided with the fins 13.

The plurality of fins 13 protrude from the surface of the flange portion 12. Each of the plurality of fins 13 is formed in a tabular shape, and functions as a heat dissipation fin.

The main body section 10 has a function of storing the light emitting section 20, the power supply section 30, and the like, and has a function of dissipating heat generated in the light emitting section 20 or the power supply section 30 to the outside of the lighting device 1.

For this reason, the main body section 10 may be made of a material with high thermal conductivity in consideration of dissipation of heat to the outside. For example, the main body section 10 may be made of aluminum, an aluminum alloy, a resin with high thermal conductivity, or the like. The resin with high thermal conductivity is a resin in which, for example, fibers or particles of carbon or aluminum oxide with high thermal conductivity are mixed with a resin such as PET or nylon.

In this case, a portion such as the fins 13 which dissipate heat to the outside may be made of a material with high thermal conductivity and other portions may be made of a resin or the like.

In addition, in a case where major portions of the main body section 10 are formed by using a conductive material, in order to reliably electrically insulate the power supply terminals 31 from the portions of the main body section 10 made of a conductive material, the vicinity of the power supply terminals 31 may be covered with an insulating material (not illustrated), and the portions made of a conductive material may be disposed in the vicinity thereof. The insulating material is, for example, a resin, and is preferably a material with high thermal conductivity. The main body section 10 may be provided with a mounting unit which is attachable to and detachable from a vehicle lighting tool.

As illustrated in FIGS. 3 and 4, the light emitting section 20 is provided with a board 21, light emitting elements 22, a control element 23, wiring patterns 24, wirings 25, a surrounding wall member 26, a sealing portion 27, a joining portion 28, and a coating portion 29.

The board 21 is provided inside the storage portion 11 of the main body section 10.

The board 21 is formed in a tabular shape and is provided with the wiring patterns 24 on its surface.

The board 21 may be made of ceramics such as aluminum oxide or aluminum nitride.

In addition, the board 21 may employ a board obtained by coating a surface of a metal plate with ceramics.

In other words, at least the surface of the board 21 may contain ceramics.

If the board 21 is formed by using the above-described materials, heat generated in the light emitting elements 22 can be efficiently emitted via the board 21 and the main body section 10.

In addition, the board 21 may be formed of a single layer or multiple layers.

The light emitting elements 22 are provided in a plurality on the wiring patterns 24 provided on the surface of the board 21.

The light emitting elements 22 may have electrodes (not illustrated) on a surface (upper surface) opposite to the surface on which the wiring patterns 24 are provided. The electrodes (not illustrated) may be provided on the surface (lower surface) on which the wiring patterns 24 are provided, and the surface (upper surface) opposite to the surface on which the wiring patterns 24 are provided, and may be provided on either of the surfaces.

The electrodes provided on the lower surfaces of the light emitting elements 22 are electrically connected to mounting pads 24b provided in the wiring patterns 24, via a conductive thermosetting material such as a silver paste. The electrodes (not illustrated) provided on the upper surfaces of the light emitting elements 22 are electrically connected to wiring pads 24c provided in the wiring patterns 24, via the wirings 25.

The light emitting element 22 may be, for example, a light emitting diode, an organic light emitting diode, or a laser diode.

The upper surface which is a light emitting surface of the light emitting element 22 is directed toward the front side of the lighting device 1, and emits light toward the front side of the lighting device 1.

The number, sizes, and the like of the light emitting elements 22 are only examples and are not limited, and may be changed as appropriate depending on the size or an application of the lighting device 1.

The control element 23 is provided on the wiring patterns 24.

The control element 23 controls a current which flows through the light emitting element 22. In other words, the control element 23 controls light emission from the light emitting elements 22.

The number, sizes, and the like of the control elements 23 are only examples and are not limited, and may be changed as appropriate depending on the number, a specification, or the like of the light emitting elements 22.

The wiring patterns 24 are provided on at least one surface of the board 21.

The wiring patterns 24 may be provided on both of the surfaces of the board 21, but are preferably provided on one surface of the board 21 in order to reduce manufacturing cost.

The wiring patterns 24 are provided with input terminals 24a.

The input terminals 24a are provided in a plurality. The input terminals 24a are electrically connected to the power supply terminals 31 of the power supply section 30. Thus, the light emitting element 22 is electrically connected to the power supply section 30 via the wiring pattern 24.

The wirings 25 electrically connect the electrodes (not illustrated) provided on the upper surface of the light emitting elements 22 to the wiring pads 24c provided in the wiring patterns 24.

The wiring 25 may be a wiring having, for example, gold as a main component. However, the wiring 25 is not limited to a material containing gold as a main component, and may be made of a material containing, for example, copper as a main component or aluminum as a main component.

The wiring 25 is electrically connected to the electrode (not illustrated) provided on the upper surface of the light emitting element 22 and the wiring pad 24c provided in the wiring pattern 24, through, for example, ultrasonic welding or heat welding. The wiring 25 may be electrically connected to the electrode (not illustrated) provided on the upper surface of the light emitting element 22 and the wiring pad 24c provided in the wiring pattern 24, by using, for example, a wire bonding method.

In addition, a circuit component (not illustrated) or the like may be provided as necessary. The circuit component (not illustrated) may be mounted on, for example, the wiring patterns 24.

The surrounding wall member 26 is provided on the board 21 so as to surround the plurality of light emitting elements 22. The surrounding wall member 26 has, for example, an annular shape, and the plurality of light emitting elements 22 are exposed at a center 26a of the surrounding wall member 26. The shape of the surrounding wall member 26 may be an elliptical shape or a polygonal shape such as a square shape, a hexagonal shape, or an octagonal shape, and is not particularly limited.

The surrounding wall member 26 may be made of, for example, a resin. In this case, the surrounding wall member 26 is preferably made of, for example, a polyamide-based resin, polybutylene terephthalate (PBT), or polycarbonate (PC).

The surrounding wall member 26 may be made of, for example, ceramics.

In addition, particles of titanium oxide or the like may be mixed with the resin so that the reflectance of light emitted from the light emitting elements 22 is increased.

Further, a mixed material is not limited to particles of titanium oxide, and may be particles of a material with a high reflectance of light emitted from the light emitting elements 22.

The surrounding wall member 26 may be made of, for example, a white resin.

A side wall surface 26b on the center 26a side of the surrounding wall member 26 is tilted. Some of the light emitted from the light emitting elements 22 is reflected at the side wall surface 26b of the surrounding wall member 26 and is emitted toward the front side of the lighting device 1.

In addition, light, of which some is the light emitted toward the front side of the lighting device 1 from the light emitting element 22 and is totally reflected at an upper surface (an interface between the sealing portion 27 and the ambient air) of the sealing portion 27, is reflected at the side wall surface 26b on the center 26a side of the surrounding wall member 26, and is emitted toward the front side of the lighting device 1 again.

In other words, the surrounding wall member 26 can also be made to have a function of a reflector. The form of the surrounding wall member 26 is only an example and is not limited, and may be changed as appropriate.

The sealing portion 27 is provided at the center 26a of the surrounding wall member 26. The sealing portion 27 is provided to cover the inside of the surrounding wall member 26.

The sealing portion 27 is made of a light transmissive material. The sealing portion 27 may be made of, for example, a silicone resin.

The sealing portion 27 may be formed, for example, by filling the center 26a of the surrounding wall member 26 with a light transmissive resin. The filling with the resin may be performed by using, for example, a liquid quantitative ejecting device such as a dispenser.

If the center 26a of the surrounding wall member 26 is filled with a resin, mechanical external contact with the light emitting elements 22, and the wiring patterns 24, the wirings 25, and the like exposed to the center 26a of the surrounding wall member 26 can be prevented. In addition, air, moisture, or the like can be prevented from coming in contact with the light emitting elements 22, and the wiring pattern 24, the wirings 25, and the like exposed to the center 26a of the surrounding wall member 26. For this reason, reliability of the lighting device 1 can be improved.

Further, the sealing portion 27 may include phosphors. The phosphors may be, for example, yttrium-aluminum-garnet-based (YAG-based) phosphors.

For example, if the light emitting elements 22 are blue light emitting diodes, and phosphors are YAG-based phosphors, the YAG-based phosphors are excited by blue light emitted from the light emitting elements 22, and thus yellow fluorescence is radiated from the YAG-based phosphors. In addition, the blue light and the yellow light are mixed with each other, and thus white light is emitted from the lighting device 1. Further, the kind of phosphor or the kind of light emitting element 22 is only an example and is not limited, and may be changed as appropriate so that a desired emission color can be obtained according to an application or the like of the lighting device 1.

The joining portion 28 joins the surrounding wall member 26 and the board 21 to each other via the coating portion 29.

The joining portion 28 is formed in a film shape, and is provided between the surrounding wall member 26 and the coating portion 29.

The joining portion 28 may be formed by curing, for example, a silicone-based adhesive or an epoxy-based adhesive.

The joining portion 28 may be formed in the following procedure, for example.

First, a silicone-based adhesive or an epoxy-based adhesive is applied on the coating portion 29.

The adhesive is applied on the coating portion 29 by using, for example, a dispenser.

Next, the adhesive is cured by evaporating a solvent or the like so that the joining portion 28 is formed and the surrounding wall member 26 and the board 21 are also joined together via the coating portion 29.

For example, first, the surrounding wall member 26 is placed on the applied adhesive.

Subsequently, the surrounding wall member 26 is pressed so that the adhesive is brought into close contact with the surrounding wall member 26 and a position (a thickness of the adhesive) of the surrounding wall member 26 is also adjusted.

Then, the adhesive is cured by evaporating a solvent or the like.

Here, the viscosity of the uncured adhesive is preferably 1 Pa·s to 15 Pa·s.

At the above viscosity, when the adhesive is applied by using a dispenser or the like, the adhesive is easily applied in any shape.

In addition, at the above viscosity, the position of the surrounding wall member 26 can be stabilized when curing the adhesive.

In addition, if the lighting device 1 is an on-vehicle lighting device, the joining portion 28 is required to have high reliability in a wide temperature range.

For example, the on-vehicle lighting device repeatedly undergoes a temperature change in a range of −40° C. to +85° C. at intervals of predetermined time, or is thermally influenced by turning-on of the light emitting elements 22. For this reason, the surrounding wall member 26, the joining portion 28, and the board 21 expand or contract.

In this case, if the board 21 is made of ceramics, a linear expansion coefficient is about 7 ppm/K. If the surrounding wall member 26 is made of a resin, a linear expansion coefficient thereof is about 20 ppm/K to 250 ppm/K. For this reason, thermal stress is caused by the difference between the linear expansion coefficients.

Here, in order to reduce the thermal stress, a value of the linear expansion coefficient of the joining portion 28 may be set to be greater than a value of the linear expansion coefficient of the board 21 and to be smaller than a value of the linear expansion coefficient of the surrounding wall member 26.

For example, the linear expansion coefficient of the polyamide-based resin or polybutylene terephthalate (PBT) which is a material of the surrounding wall member 26 is about 80 ppm/K to 90 ppm/K. The linear expansion coefficient of ceramics which are materials of the board 21 is about 7 ppm/K. In addition, the joining portion 28 is formed by using an epoxy-based adhesive (whose linear expansion coefficient is 60 ppm/K).

As described above, if the joining portion 28 is formed by using the epoxy-based adhesive so that the linear expansion coefficient thereof lies between the linear expansion coefficients of the surrounding wall member 26 and the board 21, the thermal stress can be reduced.

However, if the joining portion 28 is formed by using the epoxy-based adhesive, since the elasticity thereof is small, the thermal stress may not be sufficiently reduced.

If the thermal stress may not be sufficiently reduced despite the epoxy-based adhesive being used, the elasticity of the joining portion 28 is preferably increased.

The joining portion 28 may be formed by using, for example, a silicone-based adhesive.

In other words, the joining portion 28 may contain a silicone resin.

In this case, if the joining portion 28 is formed by using the silicone-based adhesive, the linear expansion coefficient of the joining portion 28 becomes about 200 ppm/K.

However, the joining portion 28 formed by using the silicone-based adhesive has the high linear expansion coefficient but is highly elastic and can thus absorb expansion or contraction caused by a temperature change. For this reason, the thermal stress can be sufficiently reduced.

In addition, if the joining portion 28 is formed by using the silicone-based adhesive, the thermal stress can be reduced even in a case where the surrounding wall member 26 is required to be formed by using a material with a high linear expansion coefficient (for example, a material having 200 ppm/K to 250 ppm/K).

The coating portion 29 is provided between the board 21 and the joining portion 28.

The coating portion 29 is provided in order to improve the fixation strength between the surrounding wall member 26 and the board 21.

The coating portion 29 may contain a glass material.

Further, details of the coating portion 29 will be described later.

The power supply section 30 is provided with a plurality of power supply terminals 31.

The plurality of power supply terminals 31 extend through the storage portion 11 and the flange portion 12. One end of each of the plurality of power supply terminals 31 protrudes from the bottom of the storage portion 11, and is electrically connected to the input terminal 24a of the wiring pattern 24. The other end of each of the plurality of power supply terminals 31 is exposed from the side of the main body section 10 opposite to the side where the board 21 is provided.

In addition, the number, arrangement, form, and the like of the power supply terminals 31 are only examples and are not limited, and may be changed as appropriate.

Further, the power supply section 30 may be provided with a board (not illustrated) or circuit components such as a capacitor or a resistor. The board or the circuit component (neither are illustrated) may be provided, for example, inside the storage portion 11 or the flange portion 12.

The socket 40 is fitted to the ends of the plurality of power supply terminals 31 exposed to the main body section 10 on an opposite side to the side where the board 21 is provided.

The socket 40 is electrically connected to a power source (not illustrated) or the like.

For this reason, the socket 40 is fitted to the ends of the power supply terminals 31, and thus the light emitting elements 22 are electrically connected to the power source (not illustrated) or the like.

The socket 40 may be joined to the elements of the main body section 10 side by using, for example, an adhesive.

Next, another description will be made of the coating portion 29.

Figure 5:
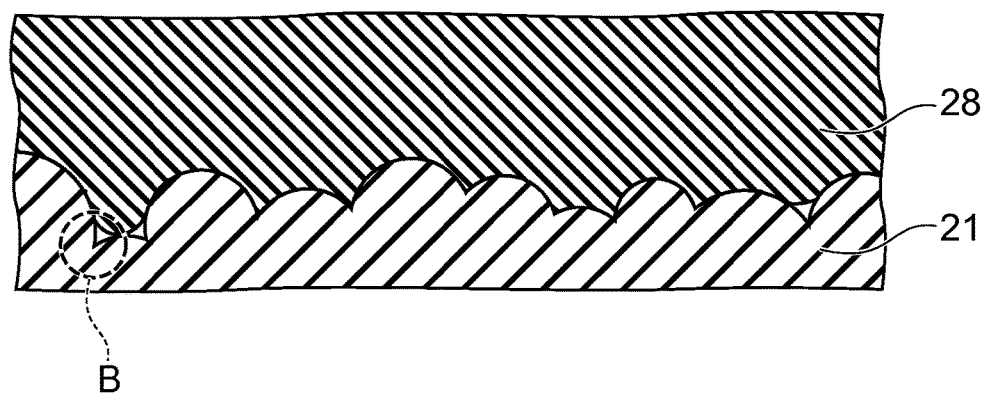
FIG. 5 is a schematic sectional view for exemplifying a case where a coating portion 29 is not provided.

FIG. 5 is a schematic sectional view for exemplifying a case where the coating portion 29 is not provided.

Figure 6:
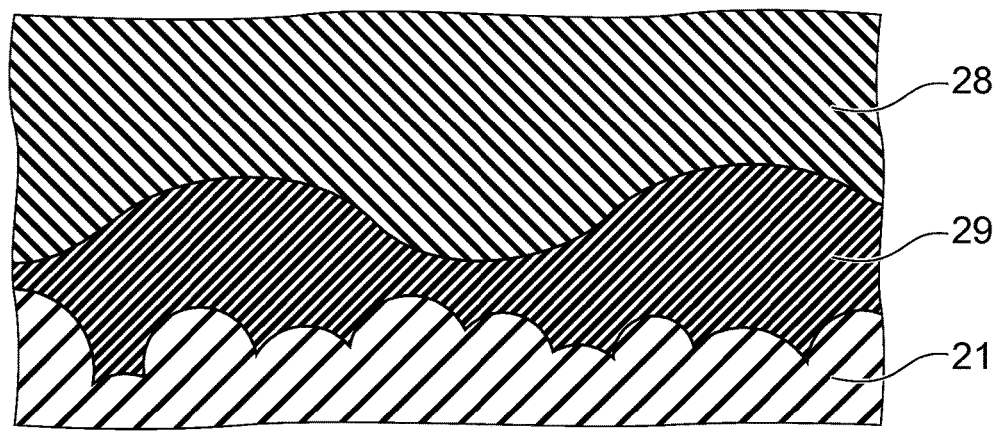
FIG. 6 is a schematic sectional view for exemplifying a case where the coating portion 29 is provided.

FIG. 6 is a schematic sectional view for exemplifying a case where the coating portion 29 is provided.

As illustrated in FIG. 5, the joining portion 28 is provided on the surface of the board 21 if the coating portion 29 is not provided.

Here, the light emitting elements 22, the control element 23, and the like are mounted on the surface of the board 21. For this reason, the flatness of the board 21 is required to be increased. Generally, the center line mean roughness Ra of the surface of the board 21 is equal to or less than 0.3 μm.

However, the board 21 made of ceramics is porous, and a fine uneven part is present on the surface thereof. For this reason, there is a case where an adhesive cannot enter the inside of the fine uneven part, and thus a gap is formed between the surface of the board 21 and the joining portion 28 as indicated by B in FIG. 5. If the gap is formed between the surface of the board 21 and the joining portion 28, separation tends to occur with the gap as a starting point when an external force is applied thereto. As a result, there is a concern that the fixation strength between the surrounding wall member 26 and the board 21 may be reduced.

In contrast, a fine uneven part is not present on the surface of the coating portion 29 made of a glass material.

For this reason, as illustrated in FIG. 6, a gap is prevented from being formed between the surface of the coating portion 29 and the joining portion 28. As a result, even if an external force is applied, separation is unlikely to occur, and thus the fixation strength between the surrounding wall member 26 and the board 21 can be improved.

In addition, if the center line mean roughness Ra of the surface of the coating portion 29 is made to exceed 0.3 μm, a contact area between the surface of the coating portion 29 and the joining portion 28 can be increased, and thus the fixation strength between the surrounding wall member 26 and the board 21 can be further improved.

Moreover, if the fixation strength between the surrounding wall member 26 and the board 21 can be improved, necessary fixation strength can be assured even when a size of the surrounding wall member 26 is made smaller (a thickness dimension is made smaller).

Thus, the lighting device 1 can be miniaturized.

The above-described coating portion 29 may be formed as follows, for example.

First, a glass paste is created.

The glass paste may contain, for example, glass powder, a filler, and an organic solvent.

The glass powder may contain, for example, silicon, barium, calcium, and bismuth.

The filler may contain, for example, aluminum oxide.

The organic solvent may be, for example, toluene or xylene.

The glass paste may further contain a coloring matter (white).

In addition, the particle diameter of the glass powder, the filler, or the like contained in the glass paste, or the viscosity or the like of the glass paste is controlled so that the center line mean roughness Ra of the surface of the coating portion 29 is made to exceed 0.3 μm.

Next, the glass paste is applied in a region where the surrounding wall member 26 is provided on the surface of the board 21, by using a screen printing method or the like.

Next, the glass paste is baked so as to form the coating portion 29.

In the above-described way, the coating portion 29 of which the center line mean roughness Ra of the surface exceeds 0.3 μm is formed on the board 21.

In addition, the coating portion 29 may be provided to also cover the inside of the surrounding wall member 26.

As described above, the sealing portion 27 may be formed by filling the center 26a of the surrounding wall member 26 with a silicone resin.

For this reason, if the coating portion 29 is provided to also cover the inside of the surrounding wall member 26, the fixation strength between the sealing portion 27 and the board 21 can be improved.

If the fixation strength between the sealing portion 27 and the board 21 can be improved, the airtightness can be improved, performance can be prevented from deteriorating due to permeation of moisture or gas, and poor conduction caused by separation of the sealing portion 27 can be prevented.

In addition, if the fixation strength between the sealing portion 27 and the board 21 can be improved, fixation between the surrounding wall member 26 and the board 21 can be reinforced.

Further, the coating portion 29 is made of a glass material and is thus insulating.

For this reason, the coating portion 29 may be provided to cover the wiring patterns 24. If the wiring patterns 24 are covered with the insulating coating portion 29, reliability of the lighting device 1 can be improved.

If the coating portion 29 is provided to also cover the inside of the surrounding wall member 26 or the upper parts of the wiring patterns 24, the coating portion 29 may be formed to cover the region where the surrounding wall member 26 is provided, the inside of the surrounding wall member 26, and the upper parts of the wiring patterns 24.

In this case, the coating portion 29 is not formed on the input terminals 24a, the mounting pads 24b, and the wiring pads 24c.

Second Embodiment

Figure 7:
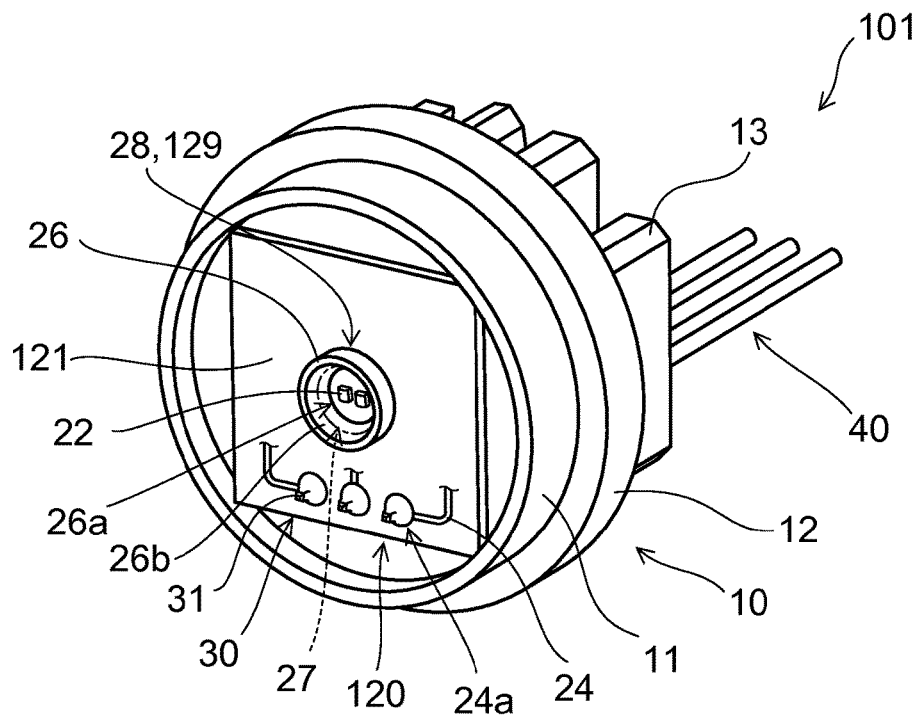
FIG. 7 is a schematic perspective view for exemplifying a lighting device 101 according to the present embodiment.
Figure 8:
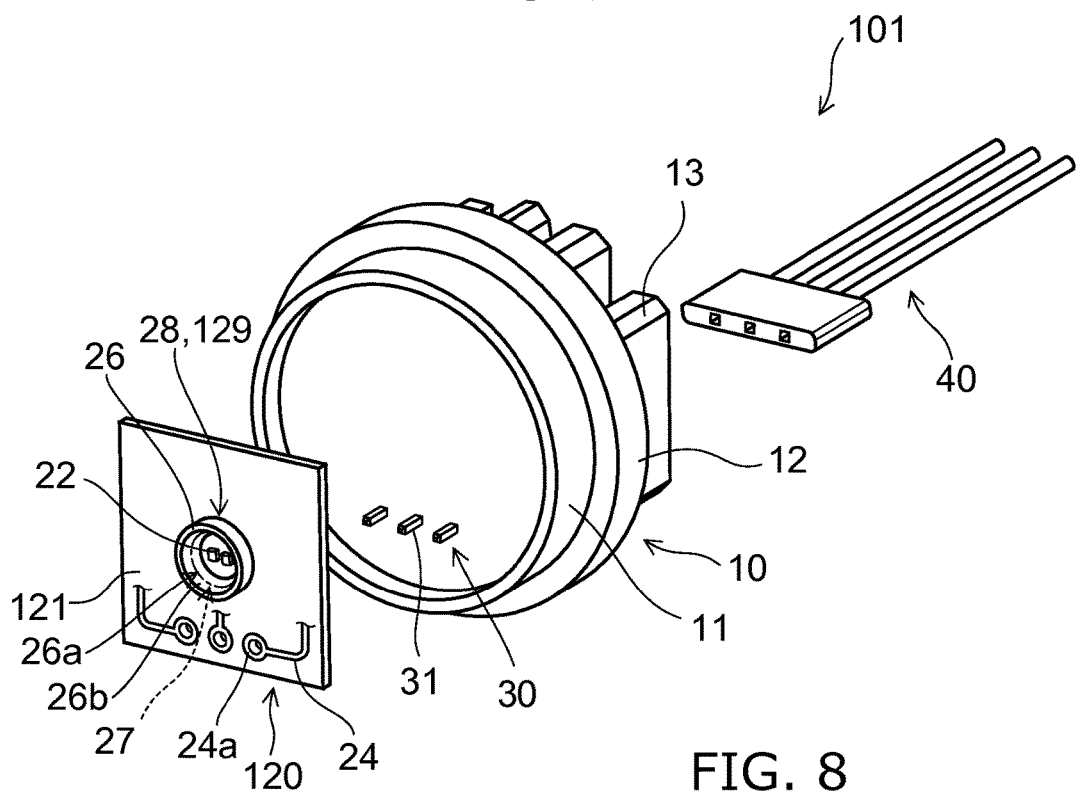
FIG. 8 is a schematic exploded view for exemplifying the lighting device 101 according to the present embodiment.

FIGS. 7 and 8 are schematic perspective views for exemplifying a lighting device 101 according to the present embodiment.

In addition, FIG. 7 is a schematic perspective view of the lighting device 101, and FIG. 8 is a schematic exploded view of the lighting device 101.

Further, in FIGS. 7 and 8, for better understanding of the drawings, the sealing portion 27 is not illustrated.

Figure 9:
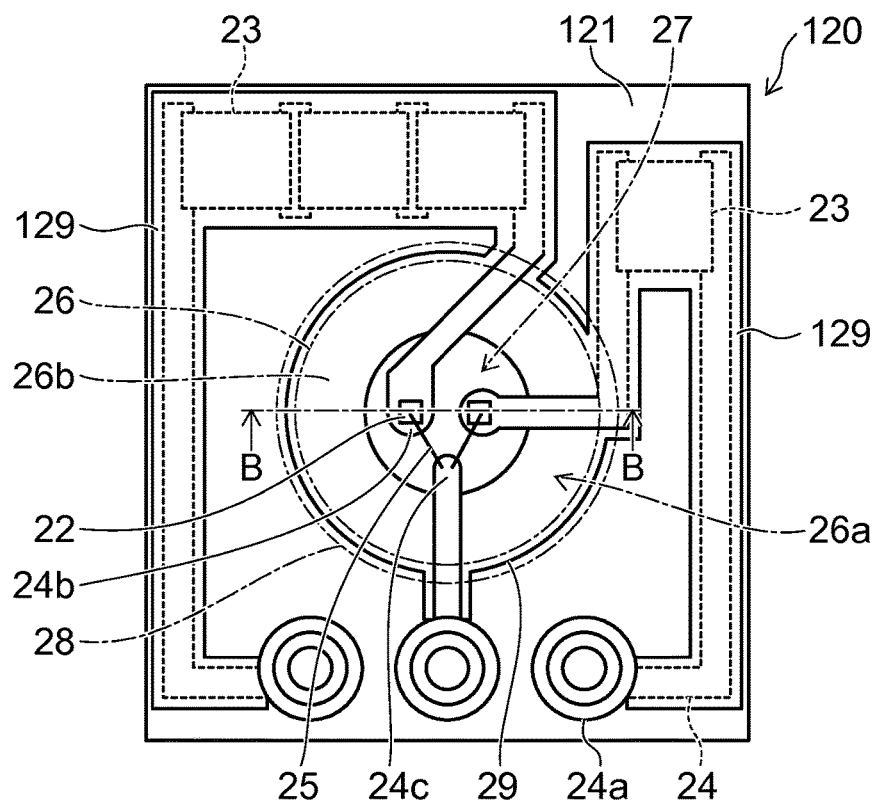
FIG. 9 is a schematic plan view of a light emitting section 120.

FIG. 9 is a schematic plan view of a light emitting section 120.

As illustrated in FIGS. 7 and 8, the lighting device 101 is provided with a main body section 10, a light emitting section 120, a power supply section 30, and a socket 40.

In the same manner as in the above-described lighting device 1, the light emitting section 120 is stored in the storage portion 11.

In addition, the main body section 10 has a function of storing the light emitting section 120, the power supply section 30, and the like, and has a function of dissipating heat generated in the light emitting section 120 or the power supply section 30 to the outside of the lighting device 101.

As illustrated in FIG. 9, the light emitting section 120 is provided with a board 121, light emitting elements 22, a control element 23, wiring patterns 24, wirings 25, a surrounding wall member 26, a sealing portion 27, a joining portion 28, and a coating portion 129.

The board 121 is provided inside the storage portion 11 of the main body section 10.

The board 121 is formed in a tabular shape and is provided with the wiring patterns 24 on its surface.

A material or a structure of the board 121 is not particularly limited. For example, the board 121 may be made of an inorganic material (ceramic) such as aluminum oxide or aluminum nitride, or an organic material such as paper phenol or glass epoxy. In addition, the board 121 may employ a board obtained by coating a surface of a metal plate with an insulator. Further, if the surface of the metal plate is coated with the insulator, the insulator may be made of an organic material, and may be made of an inorganic material.

In this case, if the amount of heat generated from the light emitting elements 22 is large, the board 121 is preferably formed by using a material with high thermal conductivity for the sake of heat dissipation. As a material with high thermal conductivity, for example, ceramics such as aluminum oxide or aluminum nitride, a resin with high thermal conductivity, or a material obtained by coating a surface of a metal plate with an insulator may be used.

In addition, the board 121 may be formed of a single layer or multiple layers.

The wiring patterns 24 are provided on at least one surface of the board 121.

The surrounding wall member 26 is provided on the board 121 so as to surround the plurality of light emitting elements 22.

The coating portion 129 is provided between the board 121 and the joining portion 28.

The linear wiring patterns 24 are present in the region where the surrounding wall member 26 is provided, and thus an uneven part is formed therein.

The coating portion 129 is provided to planarize the region where the surrounding wall member 26 is provided.

In addition, the coating portion 129 is provided to insulate the wiring patterns 24.

The coating portion 129 may contain a glass material.

Further, details of the coating portion 129 will be described later.

Next, another description will be made of the coating portion 129.

Figure 10:
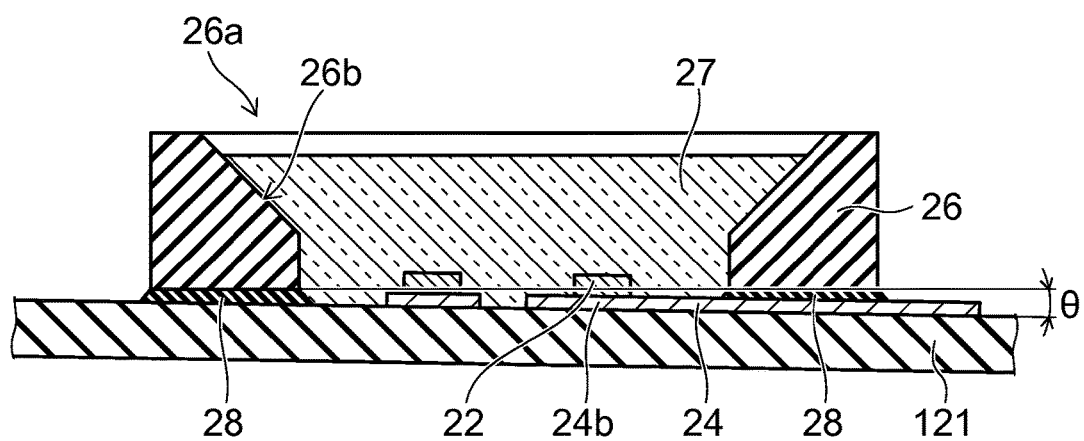
FIG. 10 is a schematic sectional view for exemplifying a case where a coating portion 129 is not provided.

FIG. 10 is a schematic sectional view for exemplifying a case where the coating portion 129 is not provided.

If the surrounding wall member 26 is joined to the board 121 via the joining portion 28, a portion where the linear wiring patterns 24 are present and a portion where the linear wiring patterns 24 are not present are formed between the surrounding wall member 26 and the board 121.

In this case, in the portion where the linear wiring pattern 24 is present, a distance between the surrounding wall member 26 and the board 121 is lengthened by the thickness dimension of the wiring pattern 24.

For this reason, as illustrated in FIG. 10, there is a concern that the surrounding wall member 26 may be joined to the surface of the board 121 so as to be tilted with respect thereto.

If a tilt angle θ of the surrounding wall member 26 relative to the surface of the board 121 increases, light distribution characteristics vary, or a state of an adhesive being applied varies, and thus there is a concern that the airtightness or the fixation strength may deteriorate, or the resin filling the inside of the surrounding wall member 26 may leak out of the surrounding wall member 26.

In this case, if the joining portion 28 is not provided on the wiring patterns 24, the surrounding wall member 26 can be prevented from being joined to the surface of the board 121 so as to be tilted with respect thereto.

However, if the joining portion 28 is not provided on the wiring patterns 24, the fixation strength (adhesive strength) between the surrounding wall member 26 and the board 121 is reduced in the portion where the wiring patterns 24 extend. If the fixation strength between the surrounding wall member 26 and the board 121 is partially reduced, the portion is partially susceptible to external stress or a thermal impact. For this reason, there is a concern that the airtightness between the surrounding wall member 26 and the board 121 may decrease, and thus performance may deteriorate due to permeation of moisture or gas, or poor conduction caused by separation of the sealing portion 27 may occur.

Therefore, in the lighting device 101 according to the present embodiment, the coating portion 129 is provided so that the surrounding wall member 26 is prevented from being provided in a tilted manner.

Figure 11:
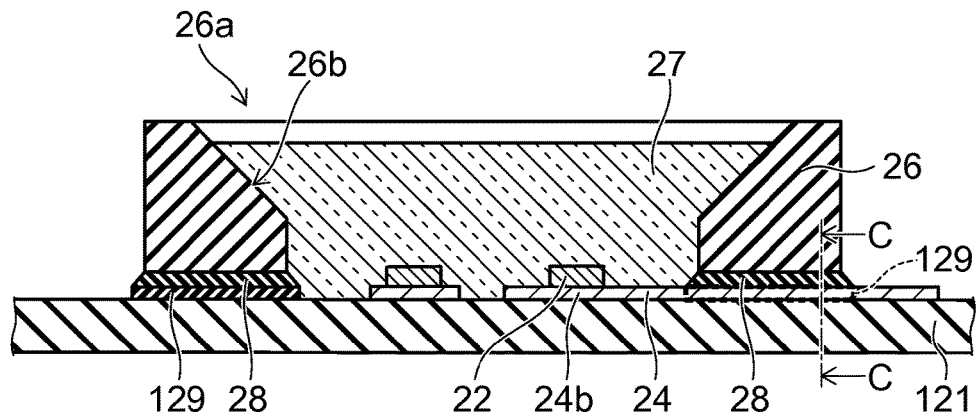
FIG. 11 is a schematic sectional view for exemplifying the coating portion 129.
Figure 12:
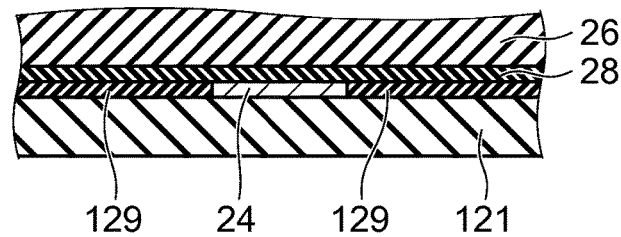
FIG. 12 is a schematic sectional view for exemplifying the coating portion 129.

FIGS. 11 and 12 are schematic sectional views for exemplifying the coating portion 129.

FIG. 11 is a sectional view taken along the line B-B in FIG. 9.

FIG. 12 is a sectional view taken along the line C-C in FIG. 11.

As illustrated in FIGS. 11 and 12, the coating portion 129 is provided between the board 121 and the joining portion 28. In addition, the coating portion 129 is provided around the wiring pattern 24 in the region where the surrounding wall member 26 is provided. In other words, the coating portion 129 is not provided on the wiring pattern 24.

Further, the thickness dimension of the coating portion 129 is substantially the same as the thickness dimension of the wiring pattern 24.

For this reason, even if the linear wiring pattern 24 is present in the region where the surrounding wall member 26 is provided, the coating portion 129 is provided, and thus the region where the surrounding wall member 26 is provided can be planarized.

As a result, the surrounding wall member 26 can be prevented from being provided in a tilted manner.

Figure 13:
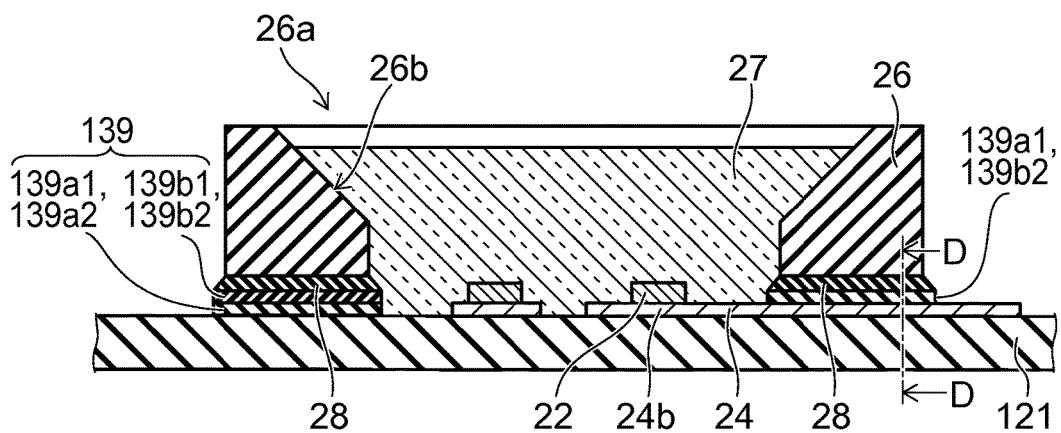
FIG. 13 is a schematic sectional view for exemplifying a coating portion 139 according to another embodiment.
Figure 14A:
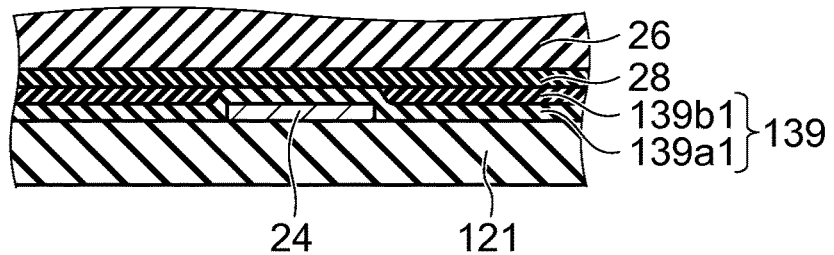
FIGS. 14(a) and 14(b) are schematic sectional views for exemplifying the coating portion 139 according to another embodiment.
Figure 14B:
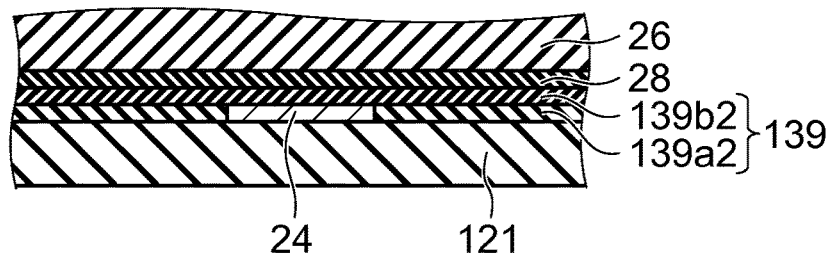

FIG. 13 and FIGS. 14(a) and 14(b) are schematic sectional views for exemplifying a coating portion 139 according to another embodiment.

FIG. 13 is a schematic sectional view of a portion taken along the line B-B in FIG. 9.

FIGS. 14(a) and 14(b) are sectional views taken along the line D-D in FIG. 13.

As illustrated in FIGS. 13 and 14(a), the coating portion 139 is provided between the board 121 and the joining portion 28. The coating portion 139 includes a first part 139a1 and a second part 139b1. The first part 139a1 and the second part 139b1 are provided integrally with each other. In addition, the first part 139a1 and the second part 139b1 may be made of the same material. The first part 139a1 and the second part 139b1 may contain the same glass material as the coating portion 129.

In addition, the coating portion 139 is provided to insulate the wiring patterns 24.

The first part 139a1 is provided to cover the region where the surrounding wall member 26 is provided. For this reason, the first part 139a1 is also provided on the wiring pattern 24 provided in the region where the surrounding wall member 26 is provided.

Further, a thickness dimension of the first part 139a1 is substantially the same as a thickness dimension of the wiring pattern 24.

The second part 139b1 is provided on the first part 139a1 and around the first part 139a1 provided on the wiring pattern 24. In other words, the second part 139b1 is provided on the first part 139a1 but is not provided on the first part 139a1 provided on the wiring pattern 24. Still further, the thickness dimension of the second part 139b1 is substantially the same as the thickness dimension of the first part 139a1.

As illustrated in FIGS. 13 and 14(b), the coating portion 139 is provided between the board 121 and the joining portion 28. The coating portion 139 includes a third part 139a2 and a fourth part 139b2. The third part 139a2 and the fourth part 139b2 are provided integrally with each other. In addition, the third part 139a2 and the fourth part 139b2 may be made of the same material. The third part 139a2 and the fourth part 139b2 may contain the same glass material as the coating portion 129.

In addition, the coating portion 139 is provided to insulate the wiring patterns 24.

The third part 139a2 is provided around the wiring pattern 24 in the region where the surrounding wall member 26 is provided. In other words, the third part 139a2 is provided on the board 121 but is not provided on the wiring pattern 24.

Further, the thickness dimension of the third part 139a2 is substantially the same as the thickness dimension of the wiring pattern 24.

The fourth part 139b2 is provided on the wiring pattern 24 and the third part 139a2.

Still further, the thickness dimension of the fourth part 139b2 is substantially the same as the thickness dimension of the third part 139a2.

In the above-described way, even if the linear wiring pattern 24 is present in the region where the surrounding wall member 26 is provided, the coating portion 139 is provided, and thus the region where the surrounding wall member 26 is provided can be planarized.

As a result, the surrounding wall member 26 can be prevented from being provided in a tilted manner.

In addition, if the first part 139a1 and the second part 139b1 are made of the same material, a surface state of the region where the joining portion 28 is provided can be made uniform. For this reason, the fixation strength between the surrounding wall member 26 and the board 121 can be stabilized.

In addition, if the lighting device 101 is an on-vehicle lighting device, a countermeasure to malfunction such as migration caused by pinholes is required to be taken. For this reason, if the second part 139b1 is laminated on the first part 139a1, the malfunction caused by the pinholes can be minimized, and thus reliability of the lighting device 101 can be further improved.

Moreover, if the fourth part 139b2 is laminated on the third part 139a2, the malfunction caused by the pinholes can be minimized, and thus reliability of the lighting device 101 can be further improved.

In addition, according to the findings of the present inventor, the tilt angle θ of the surrounding wall member 26 relative to the surface of the board 121 is preferably 1° or less by providing the coating portion 129 or the coating portion 139.

If the tilt angle θ of the surrounding wall member 26 relative to the surface of the board 121 is 1° or less, adverse effects related to the light distribution characteristics can be minimized.

Furthermore, the shape or dimensions of the coating portion 129 or the coating portion 139, the number of layers forming the coating portion 139, and the like are only examples and are not limited thereto, and may be changed as appropriate.

Figure 15:
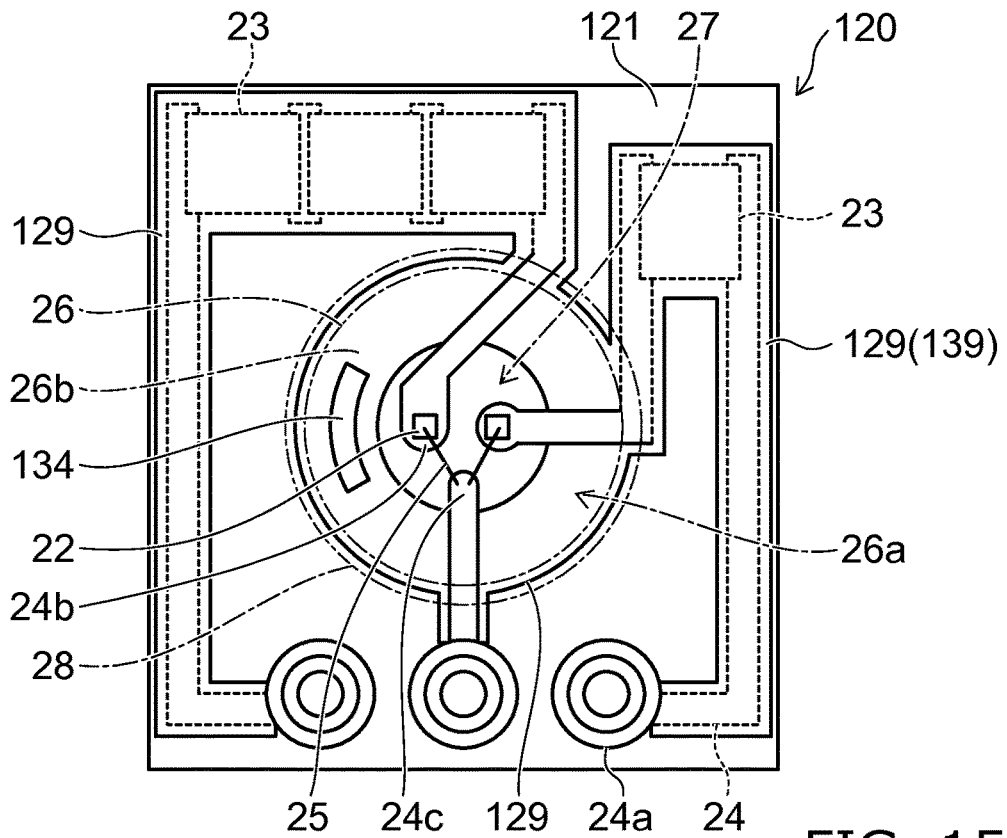
FIG. 15 is a schematic diagram for exemplifying a region in which a surrounding wall member 26 is provided according to still another embodiment.
Figure 16:
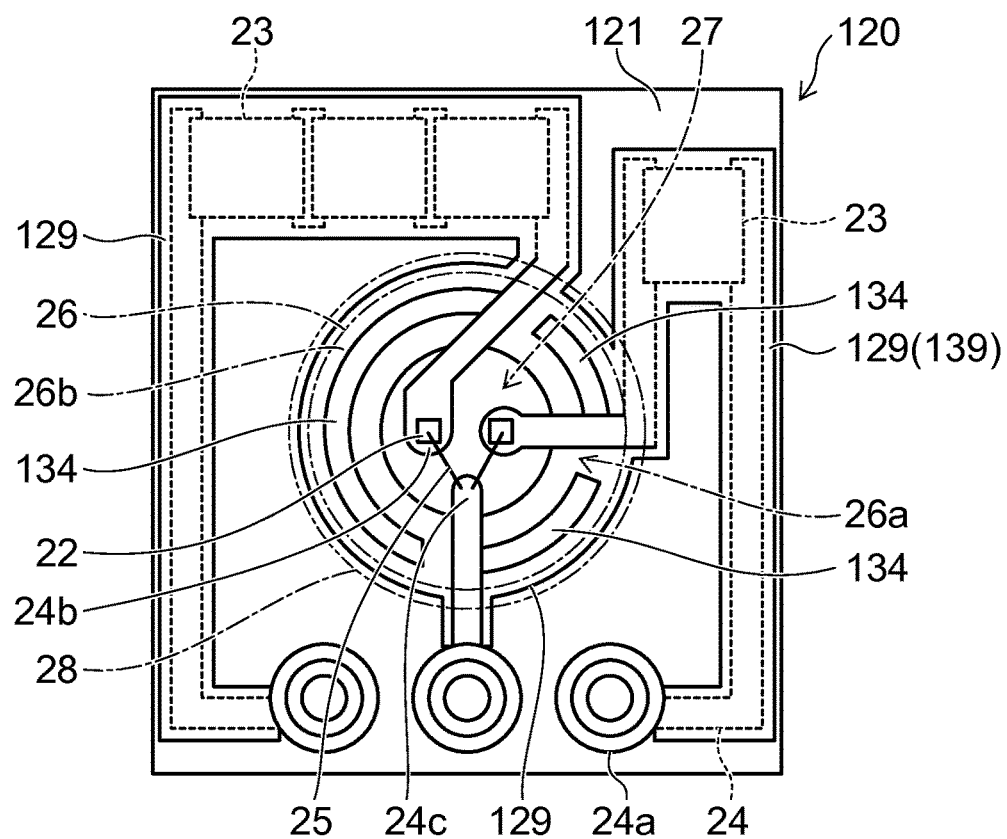
FIG. 16 is a schematic diagram for exemplifying a region in which the surrounding wall member 26 is provided according to still another embodiment.

FIGS. 15 and 16 are schematic diagrams for exemplifying a region where the surrounding wall member 26 is provided according to still another embodiment.

The wiring pattern 24 has various shapes depending on the number or a layout of light emitting elements 22. For this reason, a position where the wiring pattern 24 is provided may be biased when viewed from a central position of a region where the surrounding wall member 26 is provided.

Even in this case, the region where the surrounding wall member 26 is provided can be planarized by providing the coating portion 129 or the coating portion 139.

However, the wiring pattern 24 and the coating portion 129 or the coating portion 139 are different from each other in terms of materials used therein, manufacturing processes, or the like. For this reason, a thickness dimension of the coating portion 129 or the coating portion 139 may be slightly different from the thickness dimension of the wiring pattern 24. For example, the thickness dimension of the coating portion 129 or the coating portion 139 may be different from the thickness dimension of the wiring pattern 24 by about several μm.

Therefore, as illustrated in FIGS. 15 and 16, a support portion 134 having the same thickness dimension as the thickness dimension of the wiring pattern 24 is provided in a portion where a distance between the wiring patterns 24 in the circumferential direction of the surrounding wall member 26 is long. If the support portion 134 is provided, a region having the same height as a height of the wiring pattern 24 can be disposed nearly uniformly when viewed from the central position of the region where the surrounding wall member 26 is provided.

Here, a material of the support portion 134 may be the same as the material of the wiring pattern 24. If the material of the support portion 134 is the same as the material of the wiring pattern 24, the support portion 134 can be formed when the wiring pattern 24 is formed. For this reason, the thickness dimension of the support portion 134 and the thickness dimension of the wiring pattern 24 are easily made uniform.

In addition, the wiring pattern 24 and the support portion 134 may be formed by using, for example, a screen printing method or a plating method.

In this case, as illustrated in FIG. 15, the support portion 134 may be provided so as to be separated from the wiring pattern 24.

Further, as illustrated in FIG. 16, the support portion 134 may be provided to be connected to the wiring pattern 24.

If the support portion 134 is provided, a region having the same height as the height of the wiring pattern 24 can be disposed substantially uniformly, and thus the region where the surrounding wall member 26 is provided can be further planarized.

In addition, the width dimension of the support portion 134 may be greater or smaller than the thickness dimension of the surrounding wall member 26. Further, apart of the support portion 134 may be extracted outside the region where the surrounding wall member 26 is provided, and a circuit component may be mounted thereon. In the above-described way, an area of the board 121 can be effectively used, and thus the lighting device 101 can be miniaturized.

Still further, the shape, arrangement, the number, and the like of the support portion 134 are only examples and are not limited thereto, and may be changed as appropriate depending on an arrangement, the shape, or the like of the wiring pattern 24.

Furthermore, also in the cases exemplified in FIGS. 15 and 16, the coating portion 129 or the coating portion 139 may be provided in the same manner as described above.

If the coating portion 129 is provided, the coating portion 129 is provided around the wiring pattern 24 provided in the region where the surrounding wall member 26 is provided and around the support portion 134. In other words, the coating portion 129 is not provided on the wiring pattern 24 and the support portion 134.

If the coating portion 139 is provided, the first part 139a1 is provided to cover the region where the surrounding wall member 26 is provided. For this reason, the first part 139a1 is also provided on the wiring pattern 24 provided in the region where the surrounding wall member 26 is provided and on the support portion 134.

The second part 139b1 is provided on the first part 139a1, around the first part 139a1 provided on the wiring pattern 24, and around the first part 139a1 provided on the support portion 134. In other words, the second part 139b1 is provided on the first part 139a1, but is not provided on the first part 139a1 provided on the wiring pattern 24 and on the first part 139a1 provided on the support portion 134.

Alternatively, the third part 139a2 is provided around the wiring pattern 24 and the support portion 134 in the region where the surrounding wall member 26 is provided. In other words, the third part 139a2 is provided on the board 121 but is not provided on the wiring pattern 24 and the support portion 134.

The fourth part 139b2 is provided on the wiring pattern 24, the support portion 134, and the third part 139a2.

The coating portion 129 or the coating portion 139 may be formed as follows, for example.

First, a glass paste is created.

The glass paste may contain, for example, glass powder, a filler, and an organic solvent.

The glass powder may contain, for example, silicon, barium, calcium, and bismuth.

The filler may contain, for example, aluminum oxide.

The organic solvent may be, for example, toluene or xylene.

Next, the glass paste is applied in a predetermined region on the surface of the board 121, by using a screen printing method or the like.

If the coating portion 129 is formed, the glass paste is applied around the wiring pattern 24 in the region where the surrounding wall member 26 is provided.

If the support portion 134 is provided, the glass paste is applied around the wiring pattern 24 and the support portion 134 in the region where the surrounding wall member 26 is provided.

In addition, the glass paste is also applied on the wiring pattern 24 outside the region where the surrounding wall member 26 is provided.

If the coating portion 139 is formed, the glass paste is applied so as to cover the region where the surrounding wall member 26 is provided and the wiring pattern 24 outside the region where the surrounding wall member 26 is provided so as to form a layer which will become the first part 139a1.

Subsequently, the glass paste is applied on the layer which will become the first part 139a1 of the region where the surrounding wall member 26 is provided, around the first part 139a1 provided on the wiring pattern 24, and around the support portion 134, so as to form a layer which will become the second part 139b1.

At this time, the glass paste is also applied on the layer which will become the first part 139a1 outside the region where the surrounding wall member 26 is provided so as to form a layer which will become the second part 139b1.

Alternatively, the glass paste is applied in the region where the surrounding wall member 26 is provided, around the wiring pattern 24 outside the region where the surrounding wall member 26 is provided, and around the support portion 134, so as to form a layer which will become the third part 139a2.

Next, the glass paste is applied on the layer which will become the third part 139a2 in the region where the surrounding wall member 26 is provided, the wiring pattern 24, and the support portion 134, so as to form a layer which will become the fourth part 139b2.

At this time, the glass paste is also applied on the layer which will become the third part 139a2 outside the region where the surrounding wall member 26 is provided, and the wiring pattern 24, so as to form a layer which will become the fourth part 139b2.

Next, the glass paste is baked so as to form the coating portion 129 or the coating portion 139.

Third Embodiment

Figure 17:
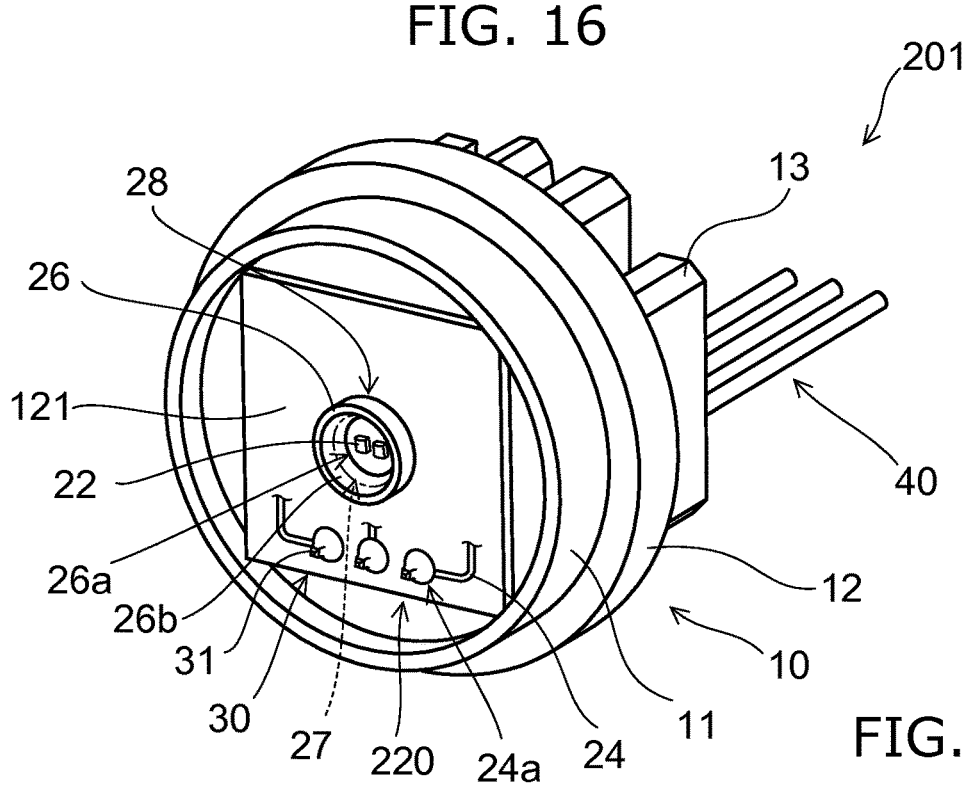
FIG. 17 is a schematic perspective view of a lighting device 201 according to the present embodiment.
Figure 18:
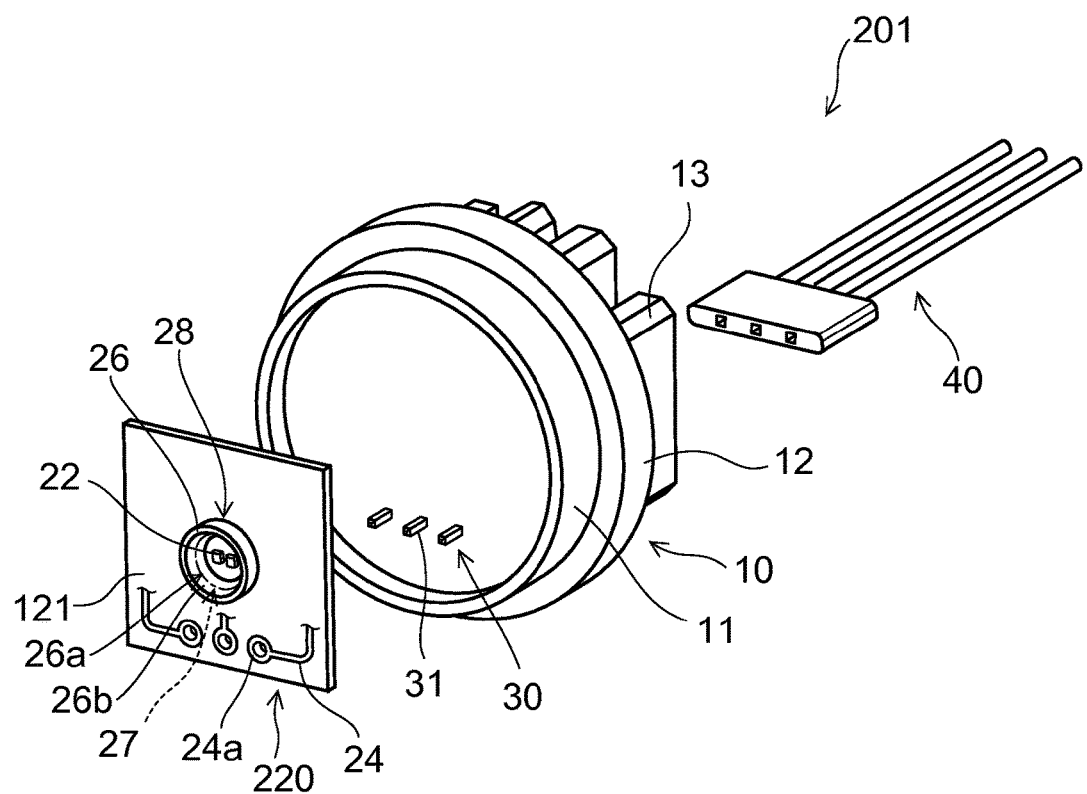
FIG. 18 is a schematic exploded view for exemplifying the lighting device 201 according to the present embodiment.

FIGS. 17 and 18 are schematic perspective views for exemplifying a lighting device 201 according to the present embodiment.

In addition, FIG. 17 is a schematic perspective view of the lighting device 201, and FIG. 18 is a schematic exploded view of the lighting device 201.

Further, in FIGS. 17 and 18, for better understanding of the drawings, the sealing portion 27 is not illustrated.

Figure 19:
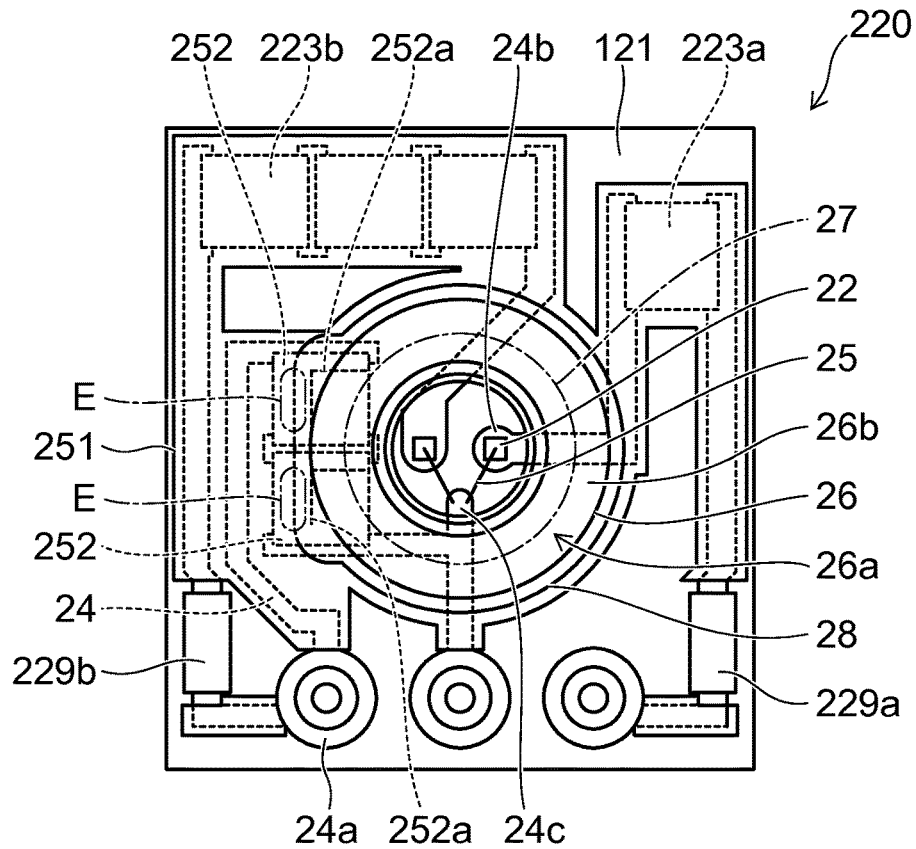
FIG. 19 is a schematic plan view of a light emitting section 220.

FIG. 19 is a schematic plan view of a light emitting section 220.

Figure 20:
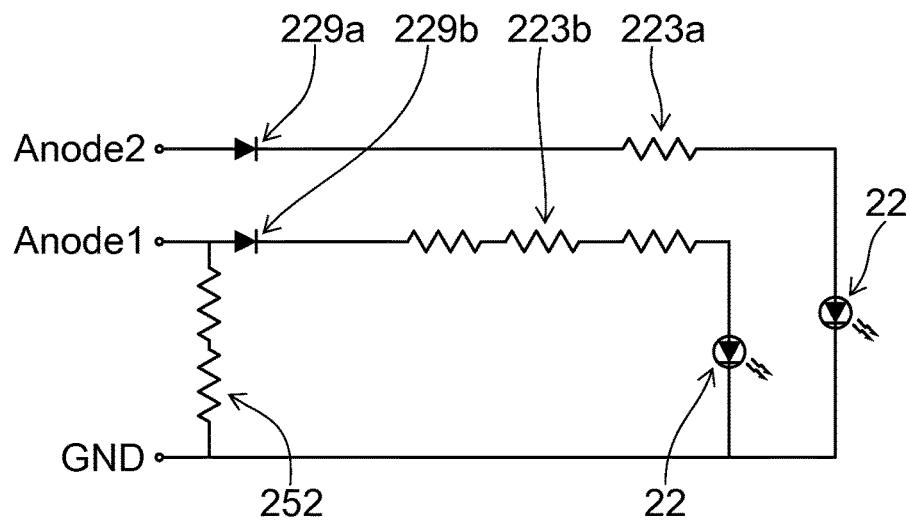
FIG. 20 is a circuit diagram of the light emitting section 220.

FIG. 20 is a circuit diagram of the light emitting section 220.

As illustrated in FIGS. 17 and 18, the lighting device 201 is provided with a main body section 10, a light emitting section 220, a power supply section 30, and a socket 40.

As illustrated in FIG. 19, the light emitting section 220 is provided with a board 121, light emitting elements 22, a control element 223a, a control element 223b, wiring patterns 24, wirings 25, a surrounding wall member 26, a sealing portion 27, a joining portion 28, a control element 229a, a control element 229b, a coating portion 251, and a control element 252.

As illustrated in FIGS. 19 and 20, the lighting device 201 is provided with a two-system circuit.

In other words, the control element 229b, the control element 223b, and the light emitting element 22 are connected in series to each other between an input terminal Anode1 and a ground terminal (GND).

In addition, the control element 252 is connected in parallel to the light emitting element 22. One end of the control element 252 is connected to an anode side of the control element 229b. The other end of the control element 252 is connected to the ground. Further, one end of the control element 252 may be connected to a cathode side of the control element 229b, and the other end of the control element 252 may be connected to the ground.

The control element 229a, the control element 223a, and the light emitting element 22 are connected in series to each other between an input terminal Anode2 and the ground terminal (GND).

Further, in this circuit, the ground terminal (GND) is used in common.

The control element 223a and the control element 223b are provided on the wiring patterns 24.

The control element 223a and the control element 223b control a current which flows through the light emitting elements 22.

Since there is a variation in forward voltage characteristics of the light emitting elements 22, if an applied voltage between Anode1 (or Anode2) and the ground terminal (GND) is constant, a variation in brightness (luminous flux, luminance, luminous intensity, and illuminance) of the light emitting elements 22 occurs. For this reason, the control element 223a and the control element 223b control values of currents which flow through the light emitting elements 22 so as to fall within a predetermined range so that the brightness of the light emitting elements 22 enters a predetermined range.

The control element 223a and the control element 223b may be, for example, resistors. The control element 223a and the control element 223b may be, for example, a surface mounted resistor, a resistor (a resistor coated with metal oxide) with a lead wire, or a film-like resistor which is formed by using a screen printing method.

In addition, the control element 223a and the control element 223b exemplified in FIG. 19 are film-like resistors.

In this case, if resistance values of the control element 223a and the control element 223b are changed, values of currents which flow through the light emitting elements 22 can be made to enter a predetermined range.

For example, if the control element 223a and the control element 223b are film-like resistors, removed portions (not illustrated) are respectively formed by removing parts of the control element 223a and the control element 223b, and thus a resistance value of each control element can be changed. In this case, if parts of the control element 223a and the control element 223b are removed, resistance values increase.

The removal of a part of the control element 223a and the control element 223b may be performed, for example, by irradiating the control element 223a and the control element 223b with laser light. The number, sizes, and the like of the control element 223a and the control element 223b are only examples and are not limited, and may be changed as appropriate depending on the number, a specification, or the like of the light emitting elements 22.

The control element 229a and the control element 229b are provided on the wiring patterns 24.

The control element 229a and the control element 229b are provided so that a reverse voltage is not applied to the light emitting elements 22, and pulse noise from a reverse direction is not applied to the light emitting elements 22.

The control element 229a and the control element 229b may be, for example, diodes. The control element 229a and the control element 229b may be, for example, surface mounted diodes or diodes with lead wires.

The control element 252 is provided on the wiring pattern 24.

The control element 252 is provided to detect disconnection of the light emitting diode or to prevent the light emitting diode from being wrongly turned on. The control element 252 is a pull-down resistor.

The control element 252 may be a film-like resistor which is formed by using a screen printing method.

The control element 252 may be a film-like resistor which is formed by using, for example, ruthenium oxide.

If the film-like resistor is formed by using ruthenium oxide, a current value relative to resistance (cross-sectional area) is preferably equal to or smaller than 15 A/mm². In addition, making a current value relative to resistance (cross-sectional area) equal to or smaller than 15 A/mm² has no relation to trimming.

If the current value relative to resistance (cross-sectional area) is equal to or smaller than 15 A/mm², resistance to a surge voltage can be improved.

In addition, the control element 252 includes a removed portion 252a which penetrates therethrough in the thickness direction.

Further, details of the control element 252 will be described later.

Still further, a case is exemplified in which the two-system circuit is provided, but the number of systems of the circuit is not limited to two systems, and may be changed as appropriate.

As illustrated in FIG. 19, the coating portion 251 is provided to cover a part of the wiring pattern 24, the control element 223a and the control element 223b which are film-like resistors, and the control element 252 which is a film-like resistor.

Furthermore, the coating portion 251 is not provided in the portions where the control element 229a, the control element 229b, and the light emitting elements 22 are provided, the portions which are connected to the wirings 25, and the portions which are connected to the power supply terminals 31.

The coating portion 251 is provided to prevent moisture, gas, or the like from coming in contact with the wiring patterns 24, the control element 223a, the control element 223b, and the control element 252, and to assure electrical insulation.

The coating portion 251 may contain a glass material.

The coating portion 251 may be formed as follows, for example.

First, a glass paste is created.

The glass paste may contain, for example, glass powder, a filler, and an organic solvent.

The glass powder may contain, for example, silicon, barium, calcium, and bismuth.

The filler may contain, for example, aluminum oxide.

The organic solvent may be, for example, toluene or xylene.

Next, the glass paste is applied in a predetermined region on the surface of the board 121, by using a screen printing method or the like.

Next, the glass paste is baked so as to form the coating portion 251.

Next, another description will be made of the control element 252.

As described above, the control element 252 is a pull-down resistor.

Here, a surge voltage may be applied to the control element 252 which is a pull-down resistor. For example, if the lighting device 201 is an on-vehicle device, noise emitted from an inductive load such as a field coil of an alternator may be applied to the control element 252. For this reason, if the lighting device 201 is an on-vehicle device, a test (field decay test) is performed thereon in order to check resistance to a negative surge voltage. Heat resistance or voltage resistance of the control element 252 is required to be increased in order to increase resistance to the negative surge voltage.

In this case, if a plurality of surface mounted resistors or resistors with lead wires are provided as the control element 252, the heat resistance or the voltage resistance can be improved. For example, as the control element 252, if ten or more surface mounted resistors whose rated power is 0.5 W or higher are connected in series to each other, or two or more resistors with lead wires whose rated power is 2 W or higher are connected in series to each other, the heat resistance or the voltage resistance can be improved.

However, if a plurality of surface mounted resistors or resistors with lead wires are provided, the area of the board 121 increases and thus there is a concern that the lighting device 201 may not be miniaturized. In addition, since the area of the board 121 increases, and a resistor is required to be mounted, there is a concern that manufacturing cost may increase.

Further, for example, if two or more film-like resistors with planar dimensions of 5 mm×5 mm are connected in series to each other as the control element 252, the heat resistance or the voltage resistance can be improved. In this case, if a film-like resistor having a large contact area with the board 121 is used, heat dissipation can be further increased compared with a surface mounted resistor or a resistor with a lead wire. Still further, if the film-like resistor is used, the resistor can be formed by using a screen printing method or the like, and thus an increase in manufacturing cost can be minimized. Furthermore, if the film-like resistor is used, the area of the board 121 can be reduced compared with a surface mounted resistor or a resistor with a lead wire.

However, if only a film-like resistor is provided as the control element 252, the area of the board 121 increases compared with a case where the control element 252 is not provided.

For example, if a resistance value of a film-like resistor is 1 kΩ (when two resistors having 500Ω are connected in series to each other), a negative surge voltage is Vs=−462 V, a thickness dimension of the film-like resistor is 10 μm, and the film-like resistor is trimmed after 40% of a width dimension thereof is left, the width dimension of the film-like resistor is about 1.55 mm.

For this reason, in the lighting device 201, the film-like resistor is used as the control element 252, and at least a part of the surrounding wall member 26 is provided on at least a part of the film-like resistor. In other words, at least a part of the control element 252 is provided between the board 121 and the surrounding wall member 26. That is, at least a part of the control element 252 overlaps at least a part of the surrounding wall member 26 in a plan view.

If the film-like resistor is used as the control element 252, and at least a part of the control element 252 is provided between the board 121 and the surrounding wall member 26, an increase in the area of the board 121 can be minimized.

In other words, the lighting device 201 can be further miniaturized.

In this case, generally, a resistance value of the control element 252 is high. For example, a resistance value of the control element 252 is about 1 kΩ to 3 kΩ. For this reason, a value of a current which flows through the control element 252 is smaller than a value of a current which flows through the light emitting element 22, and thus an amount of heat generated from the control element 252 is small.

As a result, even if at least apart of the control element 252 is provided between the board 121 and the surrounding wall member 26, the influence of heat generated from the control element 252 on the light emitting element 22 can be reduced.

However, the control element 252 generates heat to some degree. In this case, a region in which an amount of generated heat is large is located between the removed portion 252a (a portion removed through trimming) which penetrates in the thickness direction and a side of the control element 252 facing the removed portion 252a. For example, the region is a region E illustrated in FIG. 19.

For this reason, the removed portion 252a is more preferably provided so that a distance between the region E and the light emitting element 22 is lengthened.

In other words, the removed portion 252a is preferably provided on a side of the control element 252 close to the region where the light emitting element 22 is provided.

Here, if a film-like resistor is used as the control element 252, there is a concern that a resistance value may be irregular. For example, there is a concern that a resistance value may vary in a range of about ±30%. The variation in a resistance value of the control element 252 causes a variation in a current value of the light emitting element 22, and further causes a variation in an amount of emitted light or heat loss.

For this reason, if a film-like resistor is used as the control element 252, a resistance value of the control element 252 is preferably adjusted through trimming so that a value of a current which flows through the light emitting element 22 enters a desired range.

For example, if the control element 252 is irradiated with laser light so that the removed portion 252a is formed, a resistance value of the control element 252 can be adjusted. In this case, if the removed portion 252a is formed, a resistance value increases.

The coating portion 251 is provided on the control element 252, but if the control element 252 is irradiated with laser light, the removed portion 252a is formed, and a part of the coating portion 251 is also removed.

If a part of the coating portion 251 is removed, a part of the control element 252 is exposed. Therefore, there is a concern that a resistance value of the control element 252 may change due to attachment of moisture, gas, or the like, or mechanical external contact.

For this reason, at least the portion from which the coating portion 251 is removed, that is, the removed portion 252a, is required to be covered.

In this case, a glass paste may be applied so as to cover at least the removed portion 252a, and the glass paste may be baked so that a coating film containing a glass material is formed.

However, when the glass paste is baked, the control element 252 reaches a high temperature, this changes a resistance value of the control element 252, and thus there is a concern that a variation in the resistance value may occur.

In addition, a resin may be applied so as to cover at least the removed portion 252a, and a coating film may be formed.

However, a solder paste is applied in a predetermined region of the board 121 in order to connect the control element 223a and the control element 223b, the power supply terminals 31, and the like to the wiring patterns 24. For this reason, if a resin is applied before a solder paste printing step and a reflow soldering step, a gap is generated between a plate for printing the solder paste and the board in a region where the resin is applied and in the vicinity thereof, and thus the amount of the solder paste used increases. Therefore, there is a concern that a component may not be soldered to a normal position, and a residual solder may be attached between wires such that short-circuiting occurs between the wires.

For this reason, a coating film covering at least the removed portion 252a is preferably formed according to the following procedure.

First, the wiring pattern 24, the control element 252, the coating portion 251, and the like are provided on the board 121.

Next, the control element 252 is irradiated with laser light so that the removed portion 252a is formed.

Subsequently, the control element 223a, the control element 223b, and the like are soldered through reflow soldering.

Next, the light emitting elements 22 are provided on the mounting pads 24b.

Subsequently, a silicone-based adhesive or an epoxy-based adhesive which will become the joining portion 28 is applied in a predetermined region of the board 121 in order to join the surrounding wall member 26 to the board 121.

At this time, the silicone-based adhesive or the epoxy-based adhesive is applied so as to cover at least the removed portion 252a.

In this case, if the silicone-based adhesive is used, the joining portion 28 contains a silicone resin. If the joining portion 28 containing the silicone resin is used, elasticity of the joining portion 28 can be increased. For this reason, stress caused by a difference between a linear expansion coefficient of the surrounding wall member 26 and a linear expansion coefficient of the board 121 due to a temperature change can be reduced, or airtightness can be improved. In addition, if the silicone-based adhesive is used, heat resistance and light deterioration resistance of the joining portion 28 can be improved.

Next, the surrounding wall member 26 is placed on the applied adhesive, and the adhesive is cured.

If the adhesive is cured, the surrounding wall member 26 is joined to the board 121, and a coating film covering at least the removed portion 252a is also formed.

In the above-described way, an influence on the reflow soldering step can be eliminated, and a step of forming a coating film covering the removed portion 252a is not required to be separately performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

The invention claimed is:

1. A lighting device comprising:
a board that contains ceramics on at least a surface thereof;
a light emitting element that is provided on the surface of the board;
a wiring pattern that is provided on the surface of the board and is electrically connected to the light emitting element;
a surrounding wall member that is provided to surround the light emitting element;
a joining portion that is provided between the board and the surrounding wall member;
a coating portion that is provided between the board and the joining portion and contains a glass material; and
at least one support portion that is provided in a region where the surrounding wall member is provided,
wherein a part of the wiring pattern is provided in the region where the surrounding wall member is provided, and
wherein the coating portion is provided at least around the part of the wiring pattern provided in the region where the surrounding wall member is provided and around the at least one support portion.

2. The device according to claim 1, wherein a center line mean roughness of a surface of the coating portion exceeds 0.3 µm.

3. The device according to claim 1, wherein the joining portion contains a silicone resin.

4. The device according to claim 1, wherein a linear expansion coefficient of the joining portion is greater than a linear expansion coefficient of the board and is smaller than a linear expansion coefficient of the surrounding wall member.

5. The device according to claim 1, wherein the at least one support portion is connected to the wiring pattern.

6. The device according to claim 1, wherein the coating portion includes
   a first part that is provided to cover the region where the surrounding wall member is provided; and
   a second part that is provided on the first part, around the first part provided on the wiring pattern, and around the first part provided on the at least one support portion.

7. The device according to claim 1, wherein the coating portion includes
   a third part that is provided around the wiring pattern and the at least one support portion in the region where the surrounding wall member is provided; and
   a fourth part that is provided on the wiring pattern, the at least one support portion, and the third part.

8. The device according to claim 1, further comprising:
   a power supply terminal that is electrically connected to the wiring pattern; and
   a socket that is fitted to the power supply terminal.

9. The device according to claim 1, wherein the at least one support portion has a same thickness dimension as a thickness dimension of the part of the wiring pattern provided in the region where the surrounding wall member is provided.

10. The device according to claim 1, wherein the wiring pattern is divided into a plurality of portions, the at least one support portion is provided in a portion where a distance between the divided portions of the wiring pattern in a circumferential direction of the surrounding wall member is long.

11. The device according to claim 1, a material of the at least one support portion is a same as a material of the wiring pattern.

12. The device according to claim 1, wherein the at least one support portion is provided so as to be separated from the wiring pattern.

13. The device according to claim 1, a part of the at least one support portion is provided in outside the region where the surrounding wall member is provided.

14. The device according to claim 1, wherein the at least one support portion comprises a plurality of support portions.

15. The device according to claim 1, wherein the at least one support portion is connected to the wiring pattern, a material of the at least one support portion is a same as a material of the wiring pattern.

16. The device according to claim 15, wherein the at least one support portion has a same thickness dimension as a thickness dimension of the part of the wiring pattern provided in the region where the surrounding wall member is provided.

17. The device according to claim 15, a part of the at least one support portion is provided in outside the region where the surrounding wall member is provided.

18. The device according to claim 15, wherein the at least one support portion comprises a plurality of support portions.

19. The device according to claim 15, further comprising:
   a power supply terminal that is electrically connected to the wiring pattern; and
   a socket that is fitted to the power supply terminal.

* * * * *